(12) United States Patent
Herbots et al.

(10) Patent No.: US 9,018,077 B2
(45) Date of Patent: Apr. 28, 2015

(54) METHODS FOR WAFER BONDING, AND FOR NUCLEATING BONDING NANOPHASES

(75) Inventors: Nicole Herbots, Tempe, AZ (US);
Robert J. Culbertson, Tempe, AZ (US);
James Bradley, Gilbert, AZ (US);
Murdock Allen Hart, Tempe, AZ (US);
David Alexander Sell, Tempe, AZ (US);
Shawn David Whaley, Tempe, AZ (US)

(73) Assignee: Arizona Board of Regents, A Body Corporate of the State of Arizona, Acting for and on Behalf of Arizona State University, Scottsdale, AZ (US)

( * ) Notice: Subject to any disclaimer, the term of this patent is extended or adjusted under 35 U.S.C. 154(b) by 798 days.

(21) Appl. No.: 13/259,278

(22) PCT Filed: Apr. 30, 2010

(86) PCT No.: PCT/US2010/033301
§ 371 (c)(1),
(2), (4) Date: Feb. 8, 2012

(87) PCT Pub. No.: WO2010/127320
PCT Pub. Date: Nov. 4, 2010

(65) Prior Publication Data
US 2012/0132263 A1 May 31, 2012

Related U.S. Application Data

(60) Provisional application No. 61/174,138, filed on Apr. 30, 2009.

(51) Int. Cl.
*H01L 21/18* (2006.01)
*H01L 23/00* (2006.01)
(Continued)

(52) U.S. Cl.
CPC ............. *H01L 24/83* (2013.01); *Y10T 156/10* (2015.01); *H01L 33/0079* (2013.01); *H01L 21/18* (2013.01);
(Continued)

(58) Field of Classification Search
CPC ....................................................... H01L 21/18
See application file for complete search history.

(56) References Cited

U.S. PATENT DOCUMENTS 4,871,416 A 10/1989 Fukuda
5,350,492 A 9/1994 Hall et al.
(Continued)

FOREIGN PATENT DOCUMENTS

JP 02145767 6/1990
JP 10-093122 4/1998
(Continued)

OTHER PUBLICATIONS

Suni et al., Effects of Plasma Activation on Hydrophilic Bo9nding of Si and SiO2, Jorunal of The Electrochemical Society, vol./Issue 149(6), pp. G348-G351 (2002).*
(Continued)

*Primary Examiner* — Jayne Mershon
(74) *Attorney, Agent, or Firm* — McDonnell Boehnen Hulbert & Berghoff LLP

(57) ABSTRACT

Substrates may be bonded according to a method comprising contacting a first bonding surface of a first substrate with a second bonding surface of a second substrate to form an assembly; and compressing the assembly in the presence of an oxidizing atmosphere under suitable conditions to form a bonding layer between the first and second surfaces, wherein the first bonding surface comprises a polarized surface layer; the second bonding surface comprises a hydrophilic surface layer; the first and second bonding surfaces are different.

12 Claims, 3 Drawing Sheets

(51) Int. Cl.
  *H01L 33/00* (2010.01)
  *H01L 25/065* (2006.01)

(52) U.S. Cl.
  CPC ............... *H01L 24/27* (2013.01); *H01L 24/29* (2013.01); *H01L 24/32* (2013.01); *H01L 24/94* (2013.01); *H01L 25/0657* (2013.01); *H01L 2224/8385* (2013.01); *H01L 2224/8389* (2013.01); *H01L 2224/83894* (2013.01); *H01L 2924/01013* (2013.01); *H01L 2924/01032* (2013.01); *H01L 2924/0105* (2013.01); *H01L 2924/01051* (2013.01); *H01L 2924/01052* (2013.01); *H01L 2924/01057* (2013.01); *H01L 2924/01073* (2013.01); *H01L 2924/01077* (2013.01); *H01L 2924/01082* (2013.01); *H01L 2924/07802* (2013.01); *H01L 2924/10329* (2013.01); *H01L 2924/3025* (2013.01); *H01L 2224/2919* (2013.01); *H01L 2924/01005* (2013.01); *H01L 2924/01006* (2013.01); *H01L 2924/01023* (2013.01); *H01L 2924/01033* (2013.01); *H01L 2924/0104* (2013.01); *H01L 2924/01041* (2013.01); *H01L 2924/01067* (2013.01); *H01L 2924/01068* (2013.01); *H01L 2924/01072* (2013.01); *H01L 2924/01074* (2013.01); *H01L 2924/01075* (2013.01); *H01L 2924/0665* (2013.01); *H01L 2924/0132* (2013.01)

(56) References Cited

U.S. PATENT DOCUMENTS

| | | | |
|---|---|---|---|
| 6,023,082 | A | 2/2000 | McKee et al. |
| 6,511,876 | B2 | 1/2003 | Buchanan et al. |
| 6,613,677 | B1 * | 9/2003 | Herbots et al. .............. 438/694 |
| 6,902,987 | B1 | 6/2005 | Tong et al. |
| 7,358,152 | B2 | 4/2008 | Kub et al. |
| 7,851,365 | B1 | 12/2010 | Herbots et al. |
| 2004/0229444 | A1 * | 11/2004 | Couillard et al. .............. 438/455 |
| 2007/0161494 | A1 | 7/2007 | Fukuyama et al. |
| 2007/0166947 | A1 * | 7/2007 | Gadkaree et al. .............. 438/404 |
| 2008/0014712 | A1 | 1/2008 | Bourdelle et al. |
| 2008/0280420 | A1 * | 11/2008 | Yamazaki .................... 438/458 |
| 2009/0286382 | A1 * | 11/2009 | Huff .............................. 438/455 |

FOREIGN PATENT DOCUMENTS

| | | |
|---|---|---|
| JP | 10-223878 | 8/1998 |
| JP | 2006-140445 | 6/2006 |
| KR | 10-0674708 | 1/2007 |

OTHER PUBLICATIONS

Armistead et al.. The Surface Hydroxylation of Silica, JOuranl of PHyscial Chemistry, vol. 73, No. 11, pp. 3947-3953 (1969).*
Lasky, Wafer Bonding for Silicon-on-Insulator Technologies, Applied Physics Letters, vol./Issue 48, 78, 78-80 (1986).*
Masteika et al., A Review of Hydrophilic Silicon Wafer Bonding, ECS Journal of Solid State Science and Technology, vol./Issue 3 (4), pp. Q42-Q54 (2014).*
Bal et al., Hydrophoobic to Hydrophilic Transition of HF-treated Si Surface During Langmuir-Blodgett Film Deposition, Chemical Physics Letters, vol./Issue 500, pp. 90-95 (2010).*
H. Kanabe, "Ge/Si Heterojunction Photodiodes by Wafer Bonding", Lasers and Electro-Optics Society, LEOS 2006, 19th annual meeting of the IEEE, pp. 863-864, 2006.
Shaw JM et al., "Atomic Displacement free interfaces and atomic registry in SiO2/(1x1) Si(100)", J. Apply. Phys. 100, 104109 (2006).
Herbots N. et al., "The Formation of ordered ultrathin SiO2/Si(100) interfaces grown on (1x1) Si(100)", Materials Science and Engineering B87, pp. 303-316 (2001).
Atluri et al., "Hydrogen passivation of Si(100) wafers as templates for low temperature (T<600 C) epitaxy", Nucl. Instrum. Methods Phys. Res. B, vol. 118, pp. 144-150 (1996).
Hearne et al., "Cgaracterizatuon of carbon in heteroepitaxial Si1-x-yGexCy thin films via combined ion channeling and nuclear resonance analysis", Nucl. Instrum. Methods Phys. Res. B, vol. 118, pp. 88-96 (1996).
Leavitt et al., Cross sections for 170.5 backscattering of 4He from Oxygen for 4He energies between 1.8 and 5.0MeV, Nucl. Instrum. Methods Phys. Res. vol. B44, pp. 260-265 (1990).
Munkholm et al., "Observatuon of a Distributed Epitaxial Oxide in Thermally Grown SiO2 on Si(001)", Phys. Rev Lett., vol. 75, No. 23, pp. 4254-4257 (1995).
Ourmazd et al., "Si-SiO2 Transformation: Interfacial Structure and Mechanism", vol. 59, No. 2, pp. 213-216 (1987).
Queeney et al., "Infrared spectroscopic analysis of an ordered Si/SiO2 interface", Appl. Phys. Lett., vol. 84, No. 4, pp. 493-495 (2004).
Wilk et al., "High-k gate dielectrics: Current status and materials properties considerations", J. Appl. Phys., vol. 89, No. 10, pp. 5243-5275 (2001).
Bradley, "A New Heteroepitaxial Silicon Dioxide Nanophase on OH-(1X1) Silicon (100) Identified via 3.05MeV ion channeling and the new 3-D mutlistring code", Ph.D. dissertation, Arizona State University, Tempe, AZ (2006).

* cited by examiner (a)

(b)

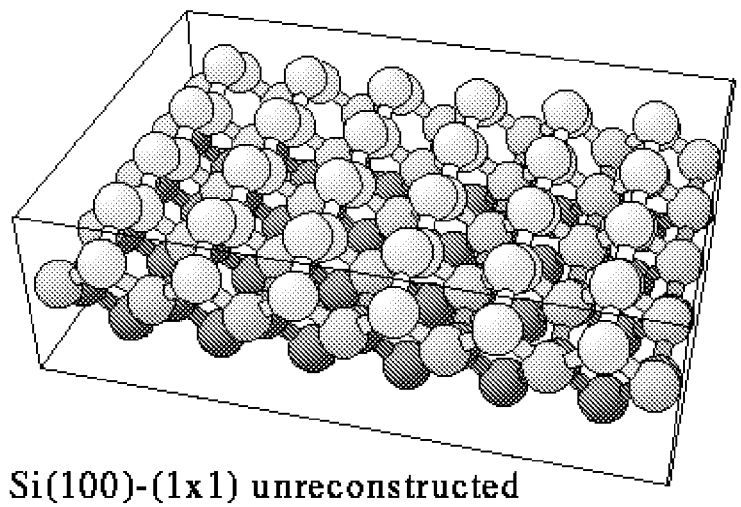
FIG. 3
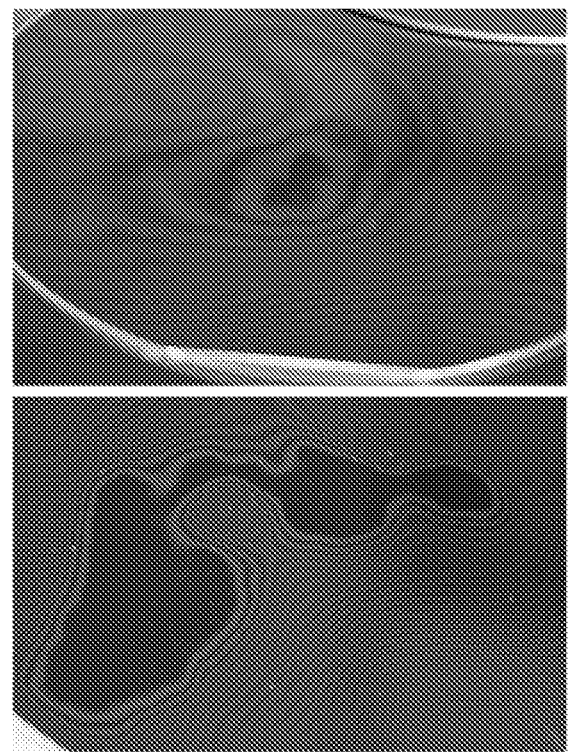
FIG. 4 (top: FIG. 4A, bottom: FIG. 4B)

METHODS FOR WAFER BONDING, AND FOR NUCLEATING BONDING NANOPHASES

CROSS-REFERENCE TO RELATED APPLICATIONS

This application claims the benefit of the filing dates, under 35 U.S.C. §119(e), of U.S. Provisional Application Ser. No. 61/174,138, filed Apr. 30, 2009, which is hereby incorporated by reference in its entirety.

FIELD OF THE INVENTION

This invention relates to methods for bonding substrates, and in particular, bonding of semiconductor and/or semiconductor oxide and nitride wafers.

BACKGROUND OF THE INVENTION

The long-term reliability of multicomponent devices such as bio-sensors and solar cells is at least in part determined by the robustness of the bonding methods used to hold the devices together. Typically, epoxy bonding methods are used to prepare such devices, but suffer from the limitations of limited longevity (10 years) as well as poor thermal matching between components which can lead to internal stresses and ultimately bonding failure. Implantable bio-sensor devices need to be hermetically sealed in a saline environment such as a human or an animal body for the lifetime of the implant.

As many biosensors and solar cells are typically based on silica wafers (borosilicate, alpha-quartz, etc.) and Si(100) wafers, there exists a need in the art for improved methods for bonding the same together. In particular, there exists a need for methods which can provide hermetically sealed devices which may be implanted into the human body. Additionally, there exist needs to improve the temperature and pressure requirements of bonding for such applications. There is also a need to improve the bonding between a broader range of materials for such applications.

SUMMARY OF THE INVENTION

Accordingly, in a first aspect, the invention provides methods for bonding substrates comprising contacting a first surface of a first substrate with a second surface of a second substrate to form an assembly; and compressing the assembly in the presence of an oxidizing atmosphere under suitable conditions to form a bonding layer between the first and second surfaces, wherein the first surface comprises a polarized surface layer; the second surface comprises a hydrophilic surface layer; the first and second surfaces are different.

In another aspect, the invention provides methods for bonding substrates comprising contacting a first bonding surface comprising O2H2Si(1×1)(100) of a first substrate comprising Si with a second bonding surface of a second substrate comprising a silicate to form an assembly; and compressing the assembly in the presence of an oxidizing atmosphere under suitable conditions to form a bonding layer between the first and second bonding surfaces.

In another aspect, the invention provides methods for bonding substrates comprising contacting a first bonding surface comprising hydroxy-terminated silica of a first substrate comprising a silicate with a second bonding surface comprising SiOx, where 0<x≤2, of a second substrate comprising a silicate to form an assembly; and compressing the assembly in the presence of an oxidizing atmosphere under suitable conditions to form a bonding layer between the first and second bonding surfaces.

In a second aspect, the invention provides the bonded substrates formed according to the first aspect of the invention.

In a third aspect, the invention provides implantable medical devices comprising a bonded substrate of the second aspect of the invention.

In a fourth aspect, the invention provides solar cells comprising a bonded substrate of the second aspect of the invention.

BRIEF DESCRIPTION OF THE DRAWINGS

FIG. 3 shows a schematically a perspective view of a Si (100) surface.

FIG. 4 shows photographs of fused silica bonded to Si(100), according to methods of the invention.

DETAILED DESCRIPTION

The Substrates

Figure 1:
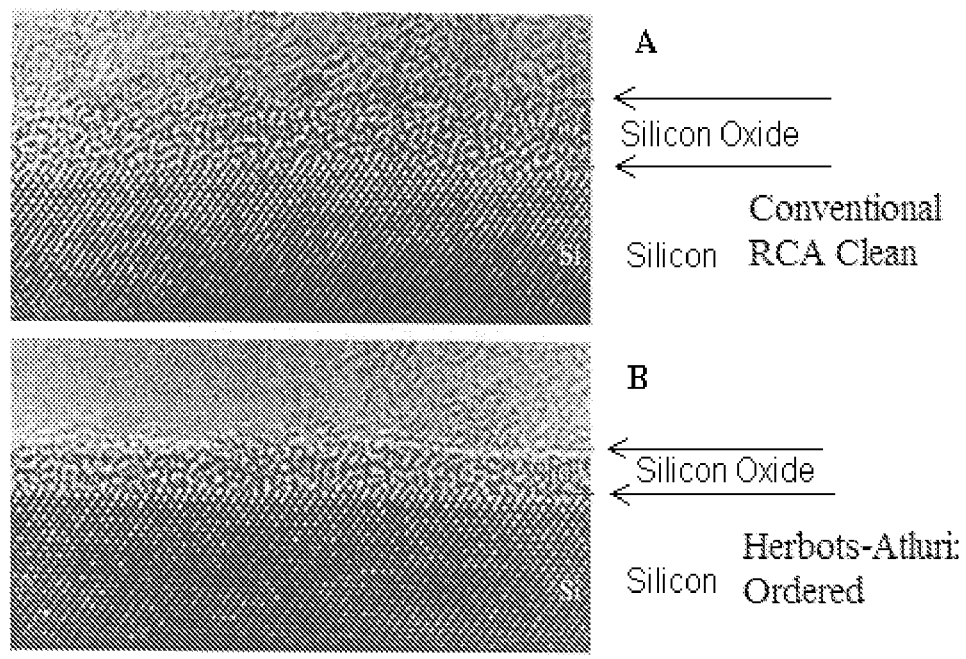
FIG. 1 shows scanning electron micrographs of $SiO_2$ formed on Si wafers, prepared using different cleaning techniques.

Substrates suitable for use in the invention can comprise any group IV element and IV, IV-IV, and IV-IV-IV multi-element semiconductor substrate, e.g. Si, Ge, $Si_xGe_{1-x}$, $Si_{1-x-y}Ge_xC_y$, $Si_{1-x-y}Ge_xSn_y$, $Si_{1-x-y-z}Ge_xSn_yC_z$, $Ge_xC_{1-x}$, etc., The substrates can comprise any polymorphic phase of the preceding as well as any oxide, nitride, oxynitride, carbide, oxycarbide, oxynitrocarbide, and hydride of the preceding Group IV semiconductor substrates and alloys. For example, the substrates can comprise an oxide of Si, Ge, $Si_xGe_{1-x}$, $Si_{1-x-y}Ge_xC_y$, $Si_{1-x-y}Ge_xSn_y$, $Si_{1-x-y-z}Ge_xSn_yC_z$, or $Ge_xC_{1-x}$. In another example, the substrates can comprise a nitride of Si, Ge, $Si_xGe_{1-x}$, $Si_{1-x-y}Ge_xC_y$, $Si_{1-x-y}Ge_xSn_y$, $Si_{1-x-y-z}Ge_xSn_yC_z$, or $Ge_xC_{1-x}$. In another example, the substrates can comprise an oxynitride of Si, Ge, $Si_xGe_{1-x}$, $Si_{1-x-y}Ge_xC_y$, $Si_{1-x-y}Ge_xSn_y$, $Si_{1-x-y-z}Ge_xSn_yC_z$, or $Ge_xC_{1-x}$. In another example, the substrates can comprise a hydride of Si, Ge, $Si_xGe_{1-x}$, $Si_{1-x-y}Ge_xC_y$, $Si_{1-x-y}Ge_xSn_y$, $Si_{1-x-y-z}Ge_xSn_yC_z$, or $Ge_xC_{1-x}$. In one embodiment, the first substrate can comprise any of the preceding embodiments. In another embodiment, the second substrate can comprise any of the preceding embodiments.

The substrates can also comprise any of the preceding group IV element and IV, IV-IV, and IV-IV-IV multi-element semiconductor substrates comprising a hydroxylated surface. The substrates can also comprise any of the preceding group IV element and IV, IV-IV, and IV-IV-IV multi-element semiconductor substrates comprising a hydride-terminated surface. Further, the substrates can also comprise any polymorphic phase of the preceding as well as any oxide, nitride, oxynitride, carbide, oxycarbide, oxynitrocarbide, and hydride of the preceding Group IV semiconductor substrates and alloys comprising a hydroxylated surface. In one embodiment, the first substrate can comprise any of the preceding embodiments. In another embodiment, the second substrate can comprise any of the preceding embodiments.

Group IV element and multi-element substrates can be doped, for example, with Group III dopants such as B, Ga, Al, or In and/or Group V dopants such as N, P, As, or Sb and or Group IV dopants such as Ge, Sn, or C; and/or Group VI dopants such as O, Se, or Te. Each can be independently doped at concentrations ranging from $10^{13}$ cm$^{-3}$ to $10^{22}$ cm$^{-3}$.

For example, the substrates can comprise a material selected from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_xN_{1-x})_n$, and $(Si_{1-x-y}Ge_xC_y)_3N_{4-x-y}$. In certain embodiments, the substrate comprises Si. Various crystal orientations of the above mentioned materials can be used, especially (100) and (111). In certain other embodiments, the substrate comprises Si(100). It can also comprise oxidized Si(100). In one embodiment, the first substrate can comprise any of the preceding embodiments. In another embodiment, the second substrate can comprise any of the preceding embodiments.

Other substrates suitable for use in the invention include semiconductor oxide substrates including oxides of all group IV element and IV, IV-IV, and IV-IV-IV multi-element substances, e.g. $SiO_2$, $GeO_2$, $Si_xGe_{1-x}O_2$, $Si_{1-x-y}Ge_xC_yO_2$, $Ge_xC_{1-x}O_2$, etc. Nitride containing semiconductors such as $Si_3N_4$ or $Si_{3(1-x)}Ge_{3x}N_{4(1-\delta)}$ will function as substrates as well. Dielectrics on silicon and other group IV, IV-IV, and IV-IV-IV materials such as nitrides and oxynitrides can benefit from this method. These materials are both stable with respect to the solutions employed and can form a passivating hydrogen-based layer when exposed to a hydrogen source. They are also capable of being etched by hydrofluoric acid (HF). In certain embodiments, a substrate comprises $SiO_x$, where $0<x\leq 2$. In certain embodiments, a substrate comprises $SiO_x$, where $0<x<2$. In certain embodiments, a substrate comprises $SiO_2$. Substrates comprising $SiO_2$ include, but are not limited to, substrates comprising silicate polymorphs (amorphous, polycrystalline, or crystalline) such as thermal $SiO_2$ grown on Si, α-quartz, beta-quartz, beta-c, borosilicate wafers, alpha-cristobalite, beta-cristobalite, coesite, tridymite, amorphous silica, and the like. In one embodiment, the first substrate can comprise any of the preceding embodiments. In another embodiment, the second substrate can comprise any of the preceding embodiments.

The substrates can also be one of SiC (Silicon Carbide) various polymorphic crystalline or amorphous phases.

Additionally, other suitable substrates include a metal or semiconductor first substrate (or first surface), and its oxide as the second substrate (or surface). For example, a first substrate comprising an Al or an Al surface can be bonded with a second substrate comprising $Al_2O_3$ or an $Al_2O_3$ surface. In other examples, the second substrate can comprise $TiO_2$, or any oxide, nitride, oxynitride, carbide, oxycarbide, and oxynitrocarbide of Ti, TiW, Nb, Ta, Zr, Er, and/or La. In further examples, the second substrate can comprise a peroskvite compound used in refractory MOS gates. In one embodiment, the first substrate can comprise any of the preceding embodiments. In another embodiment, the second substrate can comprise any of the preceding embodiments.

In one embodiment, the first and second substrates each independently comprise (i) an optionally doped group IV element, or optionally doped IV-IV or optionally doped IV-IV-IV multi-element semiconductor; (ii) an polymorphic phase, oxide, nitride, oxynitride, carbide, oxycarbide, oxynitrocarbide, or hydride of an optionally doped group IV element, or an optionally doped IV-IV or an optionally doped IV-IV-IV multi-element semiconductor; or (iii) Al, $Al_2O_3$, Ti, $TiO_2$, any oxide, nitride, oxynitride, carbide, oxycarbide, and oxynitrocarbide of Ti, TiW, Nb, Ta, Zr, Er, or La, or mixtures thereof, or a peroskvite compound used in refractory MOS gates, wherein any of (i)-(iii), each has an optionally hydroxylated or hydride-terminated surface. In one embodiment, the first substrate can comprise any of the preceding embodiments. In another embodiment, the second substrate can comprise any of the preceding embodiments.

In another embodiment, the first and second substrates each independently comprises Si, Ge, $Si_xGe_{1-x}$, $Si_{1-x-y}Ge_xC_y$, $Si_{1-x-y}Ge_xSn_y$, $Si_{1-x-y-z}Ge_xSn_yC_z$, or $Ge_xC_{1-x}$. In another embodiment, the first and second substrates each independently comprises Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_xN_{1-x})_n$, $(Si_{1-x-y}Ge_xC_y)_3N_{4-x-y}$, $SiO_2$, $GeO_2$, $Si_xGe_{1-x}O_2$, $Si_{1-x-y}Ge_xC_yO_2$, $Ge_xC_{1-x}O_2$, $Si_3N_4$ or $Si_{3(1-x)}Ge_{3x}N_{4(1-\delta)}$. In one embodiment, the first substrate can comprise any of the preceding embodiments. In another embodiment, the second substrate can comprise any of the preceding embodiments.

In other embodiments, substrates can be coated with tetraethyl orthosilicate (TEOS), where the TEOS may also act as a planarization layer which wets the surface and enables the nucleation of a thicker bonding phase The substrates can be in the form of wafers; or nanobeads comprising the materials noted above and having diameters ranging from about 10 nm to 5000 nm. In this case, the nanobeads inserted between the wafers can nucleate the bonding phase on the surface of beads when inserted between wafers. In this way, the beads provide an option for a more reactive surface to put into contact with particularly inert surfaces, or surfaces that for some reason cannot be planarized. In other various embodiments of the invention, the substrates are substantially planar (i.e., wafers). When utilized, semiconductor substrates can have a polished surface, as known to those skilled in the art. When used as wafers in the present methods, the substrates can comprise any commercially available wafer, for example, having diameters ranging from 1-12 inches, although smaller and larger diameter wafers can be used.

The substrates and substrate surfaces may be doped as necessary for the required purpose. However, dopants may segregate at the bonding surfaces at processing temperatures between about 400° C. and about 1100° C. and above. In particular, when Si or silicates are doped, the roughness of the bonding surface may increase due to dopant segregation, resulting in precipitates formed at the surfaces. In certain embodiments, when the surfaces being bonded are doped (for example, with dopants such as B, P, As, Sb, or any other dopant used in Si; and/or dopants such as Ga, Al, Te, In, Sn, C, etc, for $SiO_2$ polymorphs, each at doping concentrations ranging from $10^{13}$ cm$^{-3}$ to $10^{22}$ cm$^{-3}$), the segregation peaks should be removed to promote better nucleation of the bonding interphase.

When the surfaces to be bonded comprise amorphous thermal oxide, the bonding phase is able to follow the contours of the wafer topography (e.g., Si wafer) upon which the amorphous thermal oxide was grown. However, to promote continuity of the bonding phase and ensure cohesion of the macroscopic bonding over large wafer areas, non-amorphous surfaces can be optically or electronic grade polished to reduce any atomic steps or terraces present. The polish can enable preparation of a surface having a r.m.s of at least 2 nm or less, for example, about 0.2 nm.

Substrate Surface Preparation

Generally, the substrates can be prepared for bonding by providing a hydrophilic surface as a first bonding surface of a first substrate, and providing a polarized surface as a second bonding surface of a second substrate. The first and second bonding layers can be nucleated via initial Langmuir-Blodgett (LB) films on the surfaces to be bonded, using wet chemical processing as described below. The processing can involve two different sequences of repeated etching and oxidation ending in the final surface termination step to create two different LB films on the two substrates for bonding. The two different LB films created, one on each of the two surfaces to be bonded, are initial nanophases that initiate the chemical reaction leading to the bonding layer (i.e., a cross-bridging interphase) that bonds the two surfaces.

Polarized surfaces can be provided to at least the first bonding surface of the first substrate by cleaning a surface or the first substrate according to methods known in the art for cleaning semiconductor surfaces. For example, appropriate cleaning methods include, but are not limited to one or more of SC1 Clean ($H_2O+NH_4OH+H_2O_2$), SC2 Clean ($H_2O+HCl+H_2O_2$), RCA Clean (SC1, then SC2), Piranha Strip ($H_2SO_4+H_2O_2$), Nitride Strip ($H_3PO_4$), Oxide Strip ($HF+H_2O$), Dry Strip ($N_2O$, $O_2$, $CF_4+O_2$, or $O_3$), and/or the Herbots-Atluri clean. The substrate can be cleaned, at least, according to the Herbots-Atluri clean. In certain embodiments, the substrate is cleaned, at least, according to the Herbots-Atluri clean, and the Herbots-Atluri clean is the last cleaning performed. In various other embodiments, the substrate is cleaned according to the Herbots-Atluri clean. As has been described in U.S. Pat. No. 6,613,677, when a semiconductor substrate is cleaned according the Herbots-Atluri clean, an ordered passivating layer of oxygen and hydrogen is formed on the semiconductor substrate surface. Methods for preparing semiconductor substrates and interfacial oxides thereon, and in particular beta-cristobalite oxides, are also described in pending US patent application, with Ser. No. 11/741,563 (incorporated herein by reference). Tetragonal distortion of the ordered or epitaxial beta-cristobalite oxide surface (to match the in-plane lattice constant of the underlying substrate) causes the oxygen atoms to move closer to each other along the surface, and their mutual repulsion is shielded by the hydrogen atoms between them. In this arrangement, the charges are not free to move, they do not readily respond to the dipole moment of water molecules. Thus the layer is hydrophobic.

The atomic and charge arrangements for a polarized, hydrophobic phase of tetragonally distorted beta-cristobalite-like $SiO_2$ shows that the tetragonally distortion of beta-cristobalite-like $SiO_2$ conserves volume ($V=A^3=(0.72)^3$ $nm^3=0.5$). The 0.72 nm square base of the cubic beta-cristobalite-like cell is contracted to match the 0.54 nm base of the Si(100) cubic cell while the height expands to 1.24 nm to conserve volume ($B=V/(A_{Si})^2=1.24$ nm; $A_{Si}=0.54$ nm). Once the atoms have reached their location in the geometrically distorted structure, the electronegative oxygen atoms have to move closer along the surface, and their mutual repulsion is shielded by hydrogen atoms between them, allowing for the formation of an alternating distribution of dipoles. FIG. 1 shows scanning electron micrographs of silicon oxide films form on Si. FIG. 1A shows the surface for a conventional RCA clean. The oxide film on the unplanarized surface exhibits 2+/0.2 nm in average thickness due to surface height fluctuation cased by atomic steps every approximately 0.2-2 nm, of a 10 nm length scale. The first part of the Herbots-Atluri clean reduces the step density and extends the atomic terraces to widths at least between approximately 2 nm and 20 nm, and in some embodiments, greater than 20 nm, thereby flattening the surface on that length scale to create regions of contacts for bonding. In comparison with the RCA clean, the Herbots-Atluri clean provides an oxide on the planarized surface with 1.6 nm average thickness, with less variation (FIG. 1B).

In certain examples, a polarized substrate surface is provided by a cleaning process comprising a deionized (DI) water wash, SC1 clean, DI rinse, $H_2O/HF$ etch, DI rinse, SC2 clean, DI rinse, HF/MeOH etch, and a rinse with DI water or alcohol (methanol). In such processes the temperature of the chemical baths and rinses can be about 80° C. or slightly below, in order to achieve increased uniformity and minimize drying times prior to contacting (infra).

The ultimate uniformity, hermeticity (i.e., water-resistance), and strength of bonding of the first bonding layer can be controlled by a specific range of chemical concentrations in preceding cleaning steps, such as, the SC1 and SC2 solutions used in the sequence of chemical steps to grow the nucleation-initiating LB films. In particular, maintaining the SC2 solution close to a 5:1:1 ratio ($H_2O:HCl:H_2O_2$) to grow a chemical oxide for etching by HF in either water ($H_2O$) or alcohol (e.g., methanol) can produce a uniform and essentially flat substrate surface. Ultimately, such control can yield a more dense and continuous first bonding layer upon contacting of the substrate surfaces.

The bonding strength and uniformity can also be increased by utilizing reagents of high purity, for example, 18 MΩ $H_2O_2$, Class 1 ppb $H_2O$, HCl, HF, and $NH_4OH$ are best used to generate the 4:1:1 ($H_2O:H_2O_2:NH_4OH$) SC1, the 4:1:1 ($H_2O:H_2O_2:HCl$) SC2, the (95:5) $H_2O:HF$ and the (95:5) Alcohol:HF where the alcohol can be methanol (ethanol, or isopropanol, or mixtures thereof, etc). In particular, reagents suitable for ultra-large scale integration (ULSI) have increased purity and particulate requirements and are readily available on the market.

The first bonding surfaces prepared as described above can be maintained in the static and inert atmosphere from the conclusion of the cleaning step until the bonding step. For example, the cleaned substrate is maintained in the static and inert atmosphere for about 30 seconds to 12 months; or about 30 seconds to 3 days; or about 30 seconds to 24 hours; or about 30 seconds to 30 minutes; or about 30 seconds to 5 minutes. The static and inert atmosphere can comprise a noble gas, nitrogen, or mixtures thereof (e.g., a semiconductor-grade noble gas, nitrogen, or mixtures thereof). In certain embodiments, the static and inert atmosphere can comprise semiconductor-grade nitrogen.

After cleaning, in an intermediate processing step, the substrates may be exposed to a static and inert atmosphere for a sufficient period of time to prevent the accumulation of organic impurities which inhibit growth of the epitaxial phases of the invention. Such an exposure also serves to limit rearrangement of the freshly cleaned surface (particularly, when the substrates are cleaned by the Herbots-Atluri clean) due to impinging oxygen and moisture when the phase has just formed. Additionally, the exposure of the cleaned substrate to a static and inert atmosphere allows for an equilibrium to form between any remaining volatilizable surface adsorbed molecules and the atmosphere. Desorption of these molecules in the inert atmosphere further cleans the substrate surface.

The cleaned substrates of the various aspects of the invention may be exposed to and/or stored in a static and inert atmosphere in a sealed container. For example, the sealed container can be a fluoropolymer or glass container, or aluminum bag. In other embodiments, the sealed container is a fluoropolymer or glass container, or aluminum bag and has been cleaned according to a semiconductor-grade cleaning process. In certain other embodiments, the sealed container is a fluoropolymer or glass container, or aluminum bag and has been cleaned according to a semiconductor-grade cleaning process comprising a peroxide solution (e.g., SC1, SC2, and/or the Herbots-Atluri clean). A plurality of such sealed containers may be stored in a secondary container which itself contains a static and inert atmosphere (supra), for example, a bag or box.

Hydrophilic surfaces can be provided to at least the second bonding surface of the second substrate by cleaning a surface of the second substrate. In certain embodiments, the second substrate comprises at least one silicate surface which can be cleaned according to methods known in the art to generate a hydrophilic surface. For example, the second substrate can comprise an oxide surface grown on a semiconductor substrate which has been cleaned as described above; such oxide surfaces can be, for example, thermally prepared according to methods known in the art. In other examples, a hydrophilic surface can be prepared on a semiconductor oxide substrate via cleaning comprising a chemical etching according to the methods described above for semiconductor substrates.

In certain examples, a hydrophilic substrate surface as the second bonding surface of the second substrate is provided via a cleaning process comprising a deionized (DI) water wash, SC1 clean, DI rinse, $H_2O$/HF etch, DI rinse, SC2 clean, DI rinse, HF/$H_2O$ etch, and a rinse with DI water. In such processes, the temperature and composition of the chemical baths can be maintained as described above to increase the ultimate uniformity, hermeticity and strength of bond formed by the second bonding layer of the second substrate.

In yet another embodiment, a standard wet chemical cleaning is used, with a final surface etching which disrupts surface bonds by overetching.

In yet another embodiment, a hydrophilic oxide is grown during cleaning, using for example wet thermal oxidation, or a wet or dry chemical oxidation, to create an oxygen-poor surface layer which has charge imbalances, free charges and is thus reactive.

An alternative approach to wet chemical processing would be to use a combination of dry etching (reactive ion etching) and misting to avoid a wet chemical process. This approach can have advantages in applications with too significant surface topographies (cavities too small to wet properly) or materials too incompatible with liquid solutions.

In one embodiment, the first substrate comprises a Si(100) wafer and the second substrate comprises a SiOx bonding surface, where $0<x\leq2$ (in particular $1.7\leq x\leq1.9$). SiOx surface layers (substoichiometric $SiO_2$) can be prepared according to methods familiar to those skilled in the art, for example, by etching a $SiO_2$ surface with HF, or by plasma-enhanced chemical vapor deposition from $SiH_4$ in the presence of an oxygen-source gas such as, but not limited to $O_2$ or $N_2O$.

In one embodiment, the first bonding surface is a Si surface, and the second bonding surface is a Si surface. In another embodiment, the first bonding surface is a Si(100) surface, and the second bonding surface is a Si(100) surface. In another embodiment, the first bonding surface is a Si surface, and the second bonding surface is a $SiO_2$ surface. In another embodiment, the first bonding surface is a Si(100) surface, and the second bonding surface is a $SiO_2$ surface. In another embodiment, the first bonding surface is a $SiO_2$ surface, and the second bonding surface is a $SiO_2$ surface.

In another embodiment, the first bonding surface is a Si surface, and the second bonding surface is SiOx where $0<x\leq2$ (e.g. $1.7\leq x\leq1.9$). In another embodiment, the first bonding surface is a Si surface, and the second bonding surface is SiOx where $0<x<2$ (e.g. $1.7\leq x\leq1.9$).

In another embodiment, the first bonding surface is a Si(100) surface, and the second bonding surface is SiOx where $0<x\leq2$ (e.g. $1.7\leq x\leq1.9$). In another embodiment, the first bonding surface is a Si(100) surface, and the second bonding surface is SiOx where $0<x\leq2$ (e.g. $1.7\leq x\leq1.9$).

In another embodiment, the first bonding surface is a $SiO_2$ surface, and the second bonding surface is a SiOx where $0<x<2$ (e.g. $1.7\leq x\leq1.9$). In another embodiment, the first bonding surface is a $SiO_2$ surface, and the second bonding surface is a SiOx where $0<x\leq2$ (e.g. $1.7\leq x\leq1.9$).

In another embodiment, the first bonding surface is a hydroxy-terminated $SiO_2$ surface, and the second bonding surface is a SiOx where $0<x<2$ (e.g. $1.7\leq x\leq1.9$). In another embodiment, the first bonding surface is a hydroxy-terminated $SiO_2$ surface, and the second bonding surface is a SiOx where $0<x\leq2$ (e.g. $1.7\leq x\leq1.9$).

In certain embodiments, the interphase bonding density between a first bonding surface that is O2H2Si(1×1)(100) or hydroxy-terminated $SiO_2$ surface (SiO2-O2H2Si) and a second bonding surface that is SiOx, where $0<x<2$ (e.g. $1.7\leq x\leq1.9$), can be controlled by saturating the missing oxygen on the SiOx dangling bonds with orphaned O on the O2H2Si(1×1)(100) surface by desorbing H from the latter. In certain embodiments, about 5% to about 90% H is desorbed from the first bonding surface. In other embodiments about 10% H is desorbed from the first bonding surface.

In certain other embodiments, the second bonding surface comprises a hydroxy-terminated silicate (O2H2-Si-terminated Silicate) which can be a silicate polymorphs (amorphous, polycrystalline, or crystalline) as described herein.

Substrate Bonding

The two substrate bonding surfaces can be put into contact in an oxidizing atmosphere (e.g., air or an oxygen ambient) at a temperature less than 200° C. to generate a bonding layer between the same. The 200° C. was chosen due to manufacturing constraints to which this bonding application would be used for. If such manufacturing constraints are not present, the two substrate bonding surfaces can be put into contact in an oxidizing atmosphere (e.g., air or an oxygen ambient) at a temperature less than 1450° C. Such conditions can provide a hermetic seal (liquid-proof in saline solutions, as found in human body fluids). Room temperature conditions for bonding can be used when hermeticity is not an issue, and only strong mechanical bonding needs to be achieved. In certain embodiments, the bonding surfaces are to put into contact in an oxidizing atmosphere at a temperature less than 1450° C. or ranging from about 25° C.-200° C. or about 25° C.-100° C. or about 100° C.-200° C. or about 150° C.-200° C. or about 200° C.-1450° C.

The two surfaces are brought into contact with under a pressure ranging from about 0 (no pressure applied, simple contacting by electrostatic attraction) to about 10 MPa. Larger pressures could also be used. In some embodiments, electrostatic attraction between the layers to be bonded can be used to bring the surfaces in contact, before pressure is applied. The pressure can be applied according to methods known to those skilled in the art. For example, mechanical compression can be applied by placing the substrates between glass plates loaded with an adjustable weight. In another embodiment, polished steel plates can be used in place of the glass plates. A resilient material (such as silicone rubber sheeting) that can withstand 200° C. can be used as inserts between loading glass or steel plates. The use of the resilient material can assist in providing an even pressure distribution across the wafers to be bonded, and can be helpful in the presence of unintentional angular tilt in the system, or any substrate bow and/or warp. Blank Si wafers, stacked one above, one below the bonding pair can also be used as contacting surfaces with either rubber, steel, or glass as the next sheet upon which mechanical loading is applied to adjust the bonding pressure and hermeticity.

Figure 2:
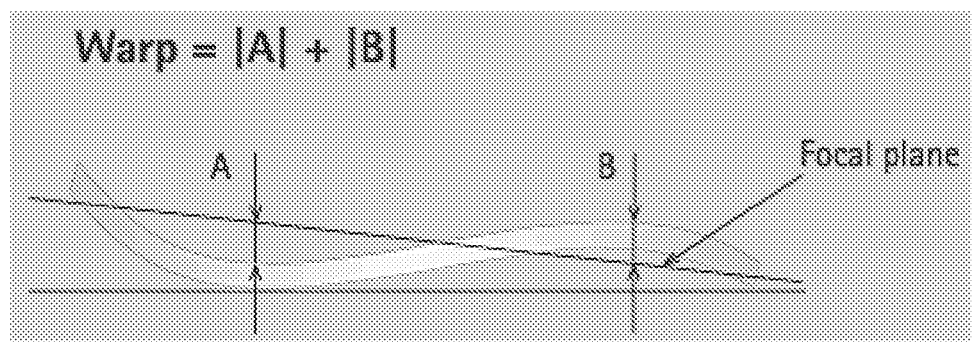
FIG. 2 shows schematically the effect of wafer clamping on bow and warp.
Figure 2:
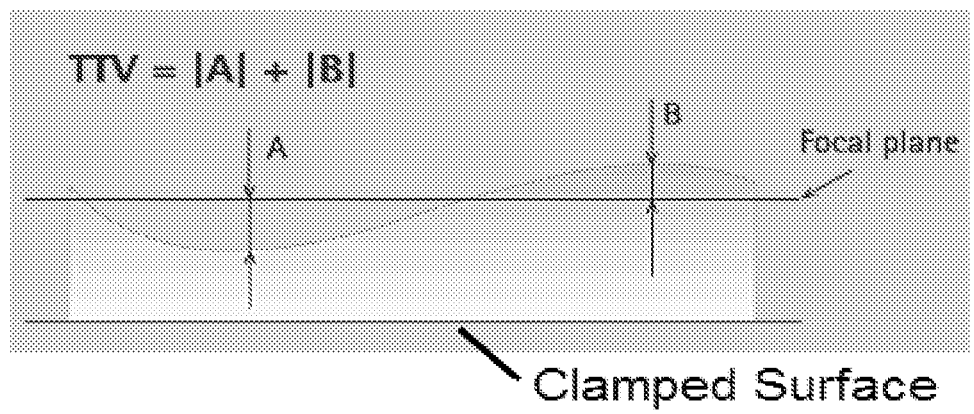

Contact between the surfaces can be maintained for at least about 1 minute, and typically between about 10 and 200 minutes to achieve bonding between the surfaces. FIG. 2 shows schematically the effect of wafer clamping on bow and warp. FIG. 2A shows a surface with a warp, indicated by distances between the wafer surface and a focal plane. A typical warp (the sum of dimensions A and B) is less than 30 μm for an X" diameter wafer. For a clamped surface (FIG. 2B), the focal plane of the wafer becomes parallel with the clamped surface. Uniformly conforming the wafer to a substantially flat plane allows contact to occur more uniformly over a macroscopic region of the wafer surface, extending to the whole surface, as opposed to more localized regions of the wafer which may be separated 10's of μm apart. Thus large scale surface flattening that can occur with the use of a resilient material in the bonding can lead to improved bonding characteristics.

An at least class 10 (e.g., class 1) environment can be used for the contacting to control for particulates, however, non-clean-room conditions can be used in case of large-scale devices where uniformity of bonding at the nanoscale is not a requirement.

Ambient humidity can range between 40 and 80% or between about 40 and 60% or about 75%. Lower humidity can improve (i.e., decrease) drying times for substrates which have been prepared as described above. For example, lower humidity can decrease drying times for substrates after the final etching and rinsing steps and thereby and decrease the latent time between formation of the first and second bonding surfaces and mechanical contact.

In certain embodiments, a built-in surface charge distribution can be achieved in an oxide (hydrophilic) surface. In such instances, a significant electrostatic attraction can be generated between the first and second bonding surfaces resulting in a room temperature reaction and bond.

The time elapsed between the preparation of the first and second bonding surfaces should be minimized, especially with respect to reactive surface preparations. Typical duration between the rinsing/drying step and the contacting step can be of the order of 30 seconds to 5 minutes with good results, with longer duration leading to weaker bonding. For example, the time should be minimized between immersion (final) rinsing step after surface termination to prepare a polarized surface and mechanical contact between the first and second bonding surfaces. In another example, silicate or the thermally oxidized surfaces processed within a final etching step with aqueous HF, as described above, are highly reactive and should be used promptly after their preparation. However, as noted above, Si(100) processed with the Herbots-Atluri clean and exposed to a static and inert atmosphere exhibits chemical and structural stability in the 24 hours range and can used at a later time.

In one example, where bonding has to occur between a silica wafer and a Si(100) wafer and where a low temperature annealing has to be made to sinter aluminum ohmic contacts, the bonding can be conducted in forming gas at about 465° C. for about 5-30 minutes (e.g., 5, 10, or 30 minutes) or longer up to 24 or 36 hours. That is, the bonding step can be integrated into the last annealing step of a processing sequence for either wafer depending on which electronic devices are to be manufactured and integrated. In the same way, the thermal annealing/sintering step of the wafer bonding sequence can also be conducted during a final rapid thermal annealing (RTA) in nitrogen gas flowing at rates from about 0.1 to about 2.5 liter minutes for anywhere from 1 second to hundreds of seconds at temperatures ranging from 450° C. to 1150° C., which are temperature ranges where RTA is typically conducted.

When RTA is used is final thermal step, dopant activation and silicide contact formation can be affected while forming the wafer bond. For example, implantation of dopant (e.g., boron, phosphorus, arsenic, and/or antimony), can be used both in the cases of Si(100) or silica polymorphs, and can be activated through such RTA thermal steps. Such themal steps can achieve nanobonding while both minimizing dopant segregation at the thermal interface; and ensuring effective thermal diffusion and electrical activation of dopants by adjustment of temperature and annealing duration. In other examples, same approach can be using simple furnace annealing. If dopants are implanted, prior to contacting and nanobonding, through refractory metallic gates or contacts (e.g., using metals such as titanium, niobium, titanium-tungsten, including solid solution of TiW, vanadium, zirconium and iron), the thermal steps can electrically activate dopants, create a nanobond, and drive silicides and gate oxide formation.

The present invention provides methods for forming a bond between two substrates between room temperature and 1450° C., with a bonding strength that can be modulated around 10 MPa.

The resulting bonding phases formed between surfaces bridges between the bonded surface both at a macroscopic and nanoscale level and has the advantage of being only a one to several molecules thick (e.g., 0.5 to 2 nm), but can range to up to 1 nm or 10 nm or 40 nm) and having a "fully compatible chemical composition", transitioning from one substrate to the other. The bonding phases are generally two-dimensional silicate polymorphic phases and may have portions that are only 1, 2 or 3 interatomic distances in regions where two atomic terraces intersect at the interface between the wafers or substrates.

The fully compatible chemical composition of the bonding phase results in the same bonding coordination in the bonding phase as in the bonded substrates. The polarized surface can enable the phase, driving and organizing the nucleation of a cross-bonding phase by guiding the alignment of charges and dipoles in the molecules in a strong chemical configuration similar to the bulk of the wafer materials being bonded, not only along the interface, but across it. In this way, the mechanical strength of the bond resulting from this template driven chemical reaction is at least as strong as the bulk of the wafer because it is essentially a similar chemical reaction across the interface. Consequently, this provides a strong bond with very low stress. The present techniques minimize built-in stress between the bonded materials, and do not require any physical deposition or plasma/sputtering/dry etching processing, to achieve bonding strength above the intrinsic breakage point of the materials being bonded. The bonding layer formed between two substrates according to the present methods typically comprises only Si, 0, with H-doping, while the structure of each specific nanophase (i.e., bonding layer) is determined by the bonded surface combination and processing conditions. For example, a bonding layer, or nanophase, between a Si surface and $SiO_2$ surface, as detailed above consists essentially of Si and O.

The nature of the nanophase (i.e., bonding layer) makes bonding by the present methods intrinsically compatible with both Si-based device and bio-medical applications. In addition, the process of nucleation and synthesis of the bonding layers (i.e., crossbridging interphases) uses chemicals and oven annealing conditions below 200° C. that are intrinsically compatible with standard devices, silicates and other ceramics processing and/or sintering.

Definitions

As used herein, the term "Herbots-Atluri Clean" refers to the semiconductor cleaning process as disclosed in U.S. Pat. No. 6,613,677, incorporated herein by reference in its entirety.

As used herein, "O2H2(1×1) Si(100)" refers to the stabilized ordered (1×1) Si<100> wafer surface having a surface comprising a 2-D Langmuir-Blodgett film consisting of ordered arrays of —OH silanol groups.

As used herein, the term "semiconductor" means any material that is not intrinsically a good conductor and that has a small enough band gap that it could conceivably be doped to function as a semiconductor (i.e. a band gap that is less than approximately 10 eV) and that is chemically and otherwise compatible with the process of the invention.

As used herein, the term "semiconductor-grade" means the component has a purity of at least 99%; for example, the purity can be at least 99.9%; in other examples, the purity can be at least 99.99%.

As used herein, the term "polarized surface layer" means a layer where the electronic charges in the surface are not free to move. Since the charges are not free to move, they do not readily respond to the dipole moment of water molecules. The layer is therefore hydrophobic, lacking affinity for water, and the water molecules only interact with each other, causing water to form "beads" on the surface.

As used herein, the term "hydrophilic surface layer" means a layer having a strong affinity for water. Water molecules are strongly polarized dipoles. Free charges at the surface of the hydrophilic surface layer respond to the water dipoles, resulting in water adhering strongly to the surface, instead of beading, resulting in a thin layer of water wetting the surface consistently.

As used herein, the term "interphase" or "bonding phase" means a phase of a material between the two phases of the materials that have been bonded. Interphases are synthesized sequentially in the form of molecular (two-dimensional) sheets with thickness ranging between 0.5 nm and about 40 nm, unless otherwise defined.

As used herein, the term "nanobonding" refers to bonding over localized regions, typically 5 nm-30 nm (the typical size of the atomic terraces), as opposed to larger scale macroscopic or chemical bonding over an entire substrate.

As used herein, the term "oxidizing atmosphere" an atmosphere containing at least 1 vol % $O_2$. Oxidizing atmospheres include, but are not limited to ambient air and essentially pure $O_2$ gas sources.

As used herein, the term "essentially flat" (atomic terraces about 20 nm (200 Å) apart in average, with no chemical oxides pitting or pinholes.

As used herein, the term "silicate" as used herein means substrates comprising $SiO_2$ or $SiOx$, including, but are not limited to, substrates comprising silicate polymorphs (amorphous, polycrystalline, or crystalline) such as thermal $SiO_2$ grown on Si, α-quartz, beta-quartz, borosilicate wafers, alpha-cristobalite, beta-cristobalite, coesite, tridymite, and/or amorphous silica.

As used herein, the term "silicate wafer" means a substrate comprising at least a $SiO_2$ surface layer and which may contain other oxide materials, for example, a borosilicate wafer or aluminosilicate wafer. In another example, a silicate wafer comprises a Si(100) substrate having a $SiO_2$ surface layer thereon. In certain embodiments, a silicate wafer comprises a Si(100) wafer having a $SiO_2$ surface layer thereon.

Exemplary Embodiment of a Wafer Bonding Processing Sequence

An exemplary embodiment of a processing sequence will now be described.

Step 1: Wafer Surface Preparation

The two wafers or substrates or surfaces to be bonded are processed in parallel so that they emerge from the surface cleaning and surface termination as simultaneously as possible. The surface preparation is meant accomplish for both wafers, the following things:

Wafer Surface 1:
  a) PLANARIZATION STEP: First using the Herbots-Alturi clean—an initial etching followed by chemical oxidation and then again etching in passivating conditions such as HF:methanol (90:10) extend atomic surfaces on both surfaces to maximize flat, two-dimensional area and minimize the number of three-dimensional steps
  b) TERMINATION STEP: this step minimizes pinholes at the surface and reduces "atomic debris" left on the surface, by adjusting the etching to 60 seconds in a 90% HF 10% methanol solution, which as to be as soon possible followed by a 5 minutes rinse in pure methanol and pulling the surface dry from the solution
  c) RINSING AND DRYING BY PULLING OUT IF THE METHANOL RINSING SOLUTION: the resulting, flattened surface is then terminated by a two-dimensional sheet of ordered aligned $Si_2O_4H_4$ molecules attached to the resulting Si(100) surface shown in perspective with the $Si_2O_4H_4$ molecules attached in ordered arrays to terminate the surface (FIG. 3). This surface nanophase provides a microscopic template to drive the bonding reaction uniformly with the densest possible location of identical bonding sites side-by-side for oxidation.

Wafer Surface 2:
  The successive etching and passivation create the same terraces formed by step (a) for wafer surface 1, but the surface is not terminated by ordered arrays of $Si_2O_4H_4$.
  b) For this surface, the pinhole density is increased by etching with aqueous HF (e.g., using $HF:H_2O$ 1:99), for 60 seconds to initiate reactive sites without creating major pitting, or pinholes larger than a few missing adatoms. The two surfaces have then strongly opposite character—one being strongly hydrophobic and the other strongly hydrophilic, one perfectly terminated and stable and the other strongly reactive. For the two wafer surfaces prepared as described above, the $SiO_2$ surface is hydrophilic, and the Si(100) surface is hydrophobic.

Step 2: Contacting

The second step consist in bringing together the two surface to be bonded and can take place at room temperature. The surfaces are put in to contact as quickly as possible as they emerge from their solutions and dry. The timing of the process can be adjusted so the time when they are dry from the last rinse coincide as much as possible; for example, by first pulling the second (reactive) wafer from the rinsing deionized water and allowing to dry (which takes typically minutes) and then pulling the first wafer from the methanol rinse; as it comes out it dries very quickly (typically 10 seconds). This maximizes bonding uniformity, reactivity, and area, and avoids particulate re-contamination.

FIG. 4 shows photographic images of two surfaces brought into contact. These show fused silica bonded to Si (100). Optical transparency of the fused silica allows the interface between the two surfaces to be observed. In FIG. 4A, a small region of wafer is in direct contact, with surrounding interference fringes. This shows that contacting can be done by simply putting the wafer on top of the other. The fringes arise because of localized separation between the wafers across the viewed area. In FIG. 4A, rigid glass clamping was used. When a resilient rubber clamp is used (FIG. 4B), flattening the two wafers surface occurs so they enter into contact over a broader area Pressure applied via the resilient material in contact with the back side of both wafers or substrates results in a larger area of contact (evidenced by the interference pattern around a larger area in direct contact). If the two wafers are compressed between resilient materials, an extended area bonds readily at room temperature.

An exemplary embodiment of a tool to accomplish bonding with compression using a resilient surface comprises two compressing plates clad with rubber.

The bonding phase forms in air at room temperature by reacting with the oxygen trapped between the two wafers being compressed with the reactive surface. As oxygen molecules decompose to react with the second surface, the bonds are being grown from the oxide templates and the reactive surface simultaneously. The density of the first surface oxide induce the new oxide molecules formed to align themselves with the first surface into a denser oxide than if the surface was not present, and cross-bonds because of the identical chemical nature of both phases in close contact. This enables overlap of extended orbitals from the reactive second surface into the first surface.

The resulting bonding phase is an oxide that is bonded to the first wafer surface oxide while growing from the second surface, in a three-dimensional, ladder-type growth as opposed to lateral growth only.

Step 3: Thermal Annealing Under Resilient Compression

The reaction can be further driven and extended into a thicker, more heremctic phase with increased tensile strength of at least 10 MPa (tester limited) by annealing below 200° C. (for example 160° C. to 180° C.) in ambient clean-room air (with 40% humidity, while remaining under resilient compression. The resilient materials can be annealing-resistant rubber up to 200° C. A steel or quartz vessel can be used to conduct the annealing.

EXAMPLES

Example 1

Wafer Cleaning and Intermediate Processing

An innovative wet chemical clean and passivation for Si(100) wafers was developed in previous research by Atluri and Herbots et al. (see, U.S. Pat. No. 6,613,677). This process is unique in that it produces an ultra-flat (1×1) Si(100) ordered surface with extremely low surface impurity contamination compared to the well-known RCA type wet chemical cleans.

After cleaning, the optional intermediate processing of the wafers prior to bonding include packing the cleaned wafers in polypropylene or fluoropolymer containers under dry nitrogen and sealed in plastic bags filled with dry nitrogen. Wafers were stored in their sealed containers under dry nitrogen for up to a year before thermal processing. Wafers can be stored under dry nitrogen for 30 minutes to 3 days prior to thermal processing, or even longer. Wafers stored for over a year in sealed containers under dry nitrogen showed no evidence of an increase in surface contamination (e.g. accumulation of carbonaceous impurities) as measured by TOF-SIMS. TOF-SIMS was collected as described in Herbots, et al., Mater. Sci. Eng. B87, 303 (2001).

Example 2

Low temperature (25° C.-200° C.) bonding between Si(100) and oxide wafers, either made of silica or oxidized Si(100) is achieved through a dual wet chemical process which terminates the stabilized ordered (1×1) Si<100> wafer surface in air at room temperature with 2-D Langmuir-Blodgett film consisting of ordered arrays of —OH silanol groups (O2H2(1×1) Si(100)). The parallel wet chemical processing of the other oxide wafer surfaces in the bonding pair renders the $SiO_2$ substoichiometric in oxygen and therefore hydrophilic with a net surface polarization, which can even result in a macroscopically observable net negative charge. If the surface of the O2H2(1×1) Si(100) is ordered, the net charge is very significant and the attractive force between it and other wafers sufficient to overcome the force of gravity to lift directly a wafer underneath for a distance of an inch to a cm or less. The overcoming of the force of gravity between the top wafer and the lower wafer to be bonded when put into contact is a good monitoring criteria for successful bonding and can be used in both in optimization testing and manufacturing.

When put into contact the Si and oxide surfaces are attracted to one another and consequently form a bond at room temperature. Two silicate wafer can also be used where one is silanol terminated (—OH termination of dangling bonds) and the other oxygen depleted (SiOx, with 0<x<2) within the top 1 nm-2 nm of the surface. One or both wafers may have an amorphous surface. However, ordering increases electrostatic attraction, charge exchanges, and room or low temperature chemical bonding and reaction to form a cross-bridging interphase.

Cross-Bonding via chemical oxidation of the surfaces in contact requires the two surfaces to be brought within nanometer separation distances to allow cross-bridging during reoxidation of both surfaces and the formation of a new interphase between the two. The application of uniform mechanical compression can overcome the Coulomb repulsion force where necessary if domains of identical charges are present on the two surfaces to be contacted, irrespective of the presence of the same surface of mixed charge domains, line charges, point charges.

Electrostatic repulsion has to be overcome, and should be minimized. However, it is a positive criteria for detecting charge imbalance and increased reactivity of the generated precursor nanophase and decreased large-scale surface geometry warping (of the order of 100 microns in wavelength) in the wafer. A 20 minutes to 24 hour 120° C.-180° C. anneal in controlled ambient air is used to activate the silanol molecular film on the (1×1)Si(100) surface [O2H2(1×1) Si(100)] and the oxidation process by which molecular cross-bridging and additional bonds between the O2H2(1×1) Si(100)) and $SiO_2$ wafers are created. One embodiment is 24 hours, 180° C., but a 20 minute can suffice under optimum polarization conditions.

The Si wafer is cleaned according to the following steps (DI=deionized water):

| | |
|---|---|
| DI rinse | 25-40 minutes |
| SC1 clean | 10 minutes |
| DI rinse | 11-12 minutes |
| $H_2O$/HF etch | 1 minute |
| DI Rinse | 12-15 minutes |
| SC2 clean | 10 minutes |
| DI rinse | 15-17 minutes |
| HF/methanol etch | 1 minute |
| Methanol wash | 5-7 minutes |

The $SiO_2$ substrate is cleaned according to the following steps:

| | |
|---|---|
| DI rinse | 35-60 minutes |
| SC1 clean | 10 minutes |
| DI rinse | 10 minutes |
| $H_2O$/HF etch | 1 minute |
| DI Rinse | 15-20 minutes |

-continued

| | |
|---|---|
| SC2 clean | 10 minutes |
| DI rinse | 10 minutes |
| HF/H$_2$O etch | 1 minute |
| H$_2$O wash (64-74° C.) | 1.5-7 minutes |

A Si(100) wafer can be bonded according to the methods of the invention to a second Si(100) wafer having a 100 nm thermal SiO$_2$ layer grown thereon. After bonding, the wafers are bonded with a bonding strength greater than 10 MPa as evidence by failure (breakage) of the wafers when attempting to pull apart by hand.

Device Manufacture

The process of this invention can be used in processes to make a variety of different devices including, a) Wafer bonding in medical electronics applications. Pairs of devices such as bio-sensors and their electronic processors which regulate drug delivery based on the sensor signal have to be integrated in one single implantable device. Such integrated implants need to be hermetically sealed to resist a saline environment such as a human or an animal body for the lifetime of the implant. The sensors and processors/regulators are typically based on silica wafers (boro-silicate, alpha-quartz, etc.) and Si(100) wafers. The present technology enables the formation of a hermetic bond between the two types of substrates using wet chemical processing. Since a standard wet chemical processing is required prior to any device processing, the present methods with their unique controlled nucleation via Langmuir-Blodgett films of precursor 2-D phases leading to hermetic, highly uniform bonding interphases (i.e., bonding layers) can easily be integrated into a current manufacturing process, requiring only the addition of alcohol such as methanol to the chemicals already typically in use: 18 MΩ H$_2$O, Class 1 ppb H$_2$O, HCl, HF, and NH$_4$OH required to generate the 4:1:1 (H$_2$O:H$_2$O$_2$:NH$_4$OH) SC1, the 4:1:1 (H$_2$O:H$_2$O$_2$:HCl), the (95:5) H$_2$O:HF and the (99:1) Alcohol:HF where the alcohol can be methanol (ethanol, isopropanol, etc. . . . ). The purity and particulate requirements for the chemicals used are similar to those required in ULSI.

Specific examples of direct applications are implants combining a glucose sensor and insulin pump in one single device ("artificial pancreas"), as well as blood chemistry sensors combined with a pump in a single implant. Other examples of hermetically bonded multiple device single implants are blood pressure monitors bonded to a medication pump that can deliver both vaso-compressive (such as proamatine, Midodrine and caffeine) and vaso-dilatative drugs to regulate pressure. The bonded wafers can also be used with protein marker sensors for specific cancer and tailor chemotherapy and the drug cocktails for antiviral medication according the concentration and distribution of specific protein cancer markers or specific viral proteins.

The real-time adjustment of drug dosing, of combination of drug cocktails and delivery via analysis of the detecting sensor signal in one integrated, postage-stamped or smaller device increases greatly the effectiveness of drug treatment by improving its targeting of specific cancer cells and virus populations, decreases side-effects from drug overload and "scorched earth approach" cancer chemotherapy, and decreases the cost of treatment by reducing the amount of drug use, both in net costs of drug amounts used, and in the elimination of often chronic side-effects such as kidney damage for drug metabolites elimination, and liver damage from the drug metabolism and decomposition itself, both well-known side-effects of any drug treatment from chemotherapy to simple NSAID (Non-Steroidal Anti-Inflammatory Drugs) from kerotolac to naproxen, ibuprofen, and acetaminophen b) Solar cell encapsulation on glass substrates. Two major issues of solar cells technology are reliability (lifetime and longevity of performance) and cost. The capability of bonding directly to glass silicon solar cells (whether low cost a-Si, polySi or single crystal substrate) can eliminate the need for less durable epoxy bonding (10 years longevity compared to 30 years for glass bonding), increase reliability (better thermal expansion match, especially, fewer cracks and delamination), increases performance (increased optical transparency and UV-IR absorption compared to epoxy bonding), and increases current collection (reduced surface recombination due to reduced surface defect density, surface conductivity can be engineered to collect current along the interface).

c) Integrated Water Compatible Semiconductor Devices

Semiconductor devices, such as sensor cavities on silica bonded to either Si(100) supported electronics, and power sources integrated on silica or silicon to such sensors, can be integrated to form marine and electronics and human body compatible medical implants 1) The Herbots-Atluri clean and precursor phases formed by the wet chemical processing described above can produce a terminated O2H2Si(1×1)(100) or O2H2-Si— terminated Silicate polymorphs (amorphous, polycrystalline, or crystalline) which can be bonded to any silicate, provided the silicate (e.g., alpha-quartz, beta-Q, beta-cristobalite, beta-c, coesite, tridymite, amorphous silica, or thermal oxides,) is oxygen depleted. Silicates can be oxygen depleted, for example, by a HF etch of the silica. Thus, one surface layer can be an oxygen depleted silicate polymorph SiO$_2$, with x<2, and the second can be H2O2-terminated by our acid-alcohol based unique chemistry as described herein.

2) The bonding phase between the O2H2(1×1)Si(100) and the oxygen-depleted SiO$_2$ (SiOx) creates a nanobond by reacting the two materials together in the presence of ambient O$_2$ and H$_2$O. Water from the ambient can catalyze the reaction (for example, at a relative humidity of about 70%-80%)

3) About 10% of the total surface area of the two wafer surfaces being contacted should be in "nano" contact via (1) the elimination of wafer warping, by resilient mechanical compression, vacuum suction, or another macroscopic mechanical method; and/or (2) atomic planarization of the Si(100) and crystalline silica polymorph by the wet chemical processing described above. Most amorphous silica does not require extensive atomic planarization. The planarization can be done prior to patterning, device formation, or sensor and cavity formation when the wet chemical processing is not compatible with the electronics deposited.

The bonding phase between the two wafer surfaces occurs both macroscopically and at the nanoscale. Large scale mechanical compression can overcome, electrostatic repulsion between domains and other features, and the peak-to-peak wafer topographical wafer warp that ranges between 40 and 160 microns. The wide atomic terraces from wet chemical planarization facilitates the creation of the interphase where the two wafer surfaces are bonded, whether both silica, Si(100) or a combination thereof. Close geometric proximity promotes formation of the interphase by reducing its final thickness to 1 nm to a few nm to less than 10 nm.

Alternatively, silica polymorphs wafer pairs, Si(100) wafer pairs, combinations thereof, and patterned combination thereof can be bonded to encapsulate electronics via a boro-silicate or high temperature-resistant photoresists or polymers. These can be kept in place provided vias. The vias can be openings in the material that can be filled with contacting, low resistance materials such as low ohmic resistance metals for electronic/electrical interconnects between electronic features on the bonded wafers Alternatively, two wafers can be bonded while electronically insulated from each other by insulating silica. Then, image charge methods, optical methods, magnetic current induction and magnetization can be used to transfer the sensor signal changes in voltage, capacitance and/or stored charges to the sensing electronics on the other side of the wafer bonding pairs. In the case of a power source, current induction and image charges can be used.

Alternately, a triply bonded wafer, such as a power source, electronics and sensors substrates can be bonded in a triplet set-up, where all the silica-silica polymorphic interphases pairs, and all the silica-silicon polymorphic interphases can be bonded, for example, Silica-Si(100)-Silicon (three wafers), or silica-silica-silica, etc. . . . There is no reason to the limit the stacking of the bonded stacked wafers to three, provided the plasticity of the silicate-based polymorphic interphase is well maintained via hydroxylation of the interphase.

4) Conditions for the bonding process after contacting include temperatures for the annealing/sintering/bonding below 200° C. where no excessive and sudden Langmuir desorption of O2H2Si can occur. A Langmuir-Blodgett thin film adsorbate of water radical (OH—) can be present, confining hydroxyl groups to the one molecular sheet of HO— bonded to dangling bonds, resulting in the O2H2Si(100) self-ordered precursor phase nucleated on (1×1) Si(100)

Remnant radical can be allowed to evaporate during the last stage of the wet chemical process—including OH-based molecules and compounds. Moisture, alcohol, and/or other liquid droplets and adsorbate remnants on top of the hydroxylated Si(100) and silica will decrease the cross-bonding density. Thus, water and alcohol-based and acid-based remnants on the surface should be limited to less 10% by volume or less than 5% by volume or less than 1% by volume according to the performance and lifetime requirements of the devices being bonded, for example, hermetically-sealed sensors electronic or power source/electronics/sensors combination.

Lifetime requirements for the electronics ranging from a few months or less than a year of full functionality can be embodied by a remnant adsorbate of 10% or less. A requirement of a decade or more—as in solar cell technology—would require of less than 5% adsorbate remnant. Medical implants would require less than 1% to create a hermetic and stable enough to match closely the lifetime of the patient (several decades, possibly 100 years). Such well controlled drying of a wet and chemically-cleaned hydrophobic wafer will result in a Langmuir-Blodgett molecular adsorbate of HO— bonded to the silica and Si(100). For devices requiring extended lifetimes (>1 year to decades) and high mechanical strength (>a few MPa/cm$^2$), the interphase bonding density should be maximized by connecting hydroxylated chains with enough plasticity to avoid brittle mechanical breakage upon further thermal annealing of stresses, while avoiding catastrophic water vapor desorption during thermal cycling that can lead to interphase fracture.

Mechanical strength of the bonding phase can be maximized by selecting a pair of surfaces on each device having O2H2Si(100)(1×1) and SiOx with x<2 as the bonding surfaces when patterning has already taken place. By aligning the bonding regions an optimum saturation of the missing oxygen on the SiOx can take place by desorbing some of the H on the O2H2Si(100)(1×1) or unordered OH—Si(100) and letting the orphaned oxygen react with the SiOx. For example, about 10% of the H can be desorbs to react with the O.

One advantage of the bonding interphase and its very controlled nucleation and growth is that it can be easily computer simulated over a large area with terraces and variations in interface "gap" and thus optimized for the number of such bonds varying $H_2O$ concentration (humidity), during contacting and gasses $O_2$ (air versus pure $O_2$), temperature can be done for optimization by a cheap computer simulation rather than complex, onerous experiments. This is very attractive for expensive or high performance electronics varying the bonds density in the interphase starting around 10% of cross-bonding, or one molecule in 10 "bridging" the interface as an interphase) and simulating percolations of saline ($H_2O$, Na, Cl—) can be an initial clinical trial or device testing prior to actual manufacturing and testing.

The present invention is illustrated by way of the foregoing description and examples. The foregoing description is intended as a non-limiting illustration, since many variations will become apparent to those skilled in the art in view thereof. It is intended that all such variations within the scope and spirit of the appended claims be embraced thereby. Each referenced document herein is incorporated by reference in its entirety for all purposes.

Changes can be made in the composition, operation and arrangement of the method of the present invention described herein without departing from the concept and scope of the invention as defined in the following claims.

We claim:

1. A method for bonding substrates comprising
   contacting a first bonding surface of a first substrate with a second bonding surface of a second substrate to form an assembly, wherein the first substrate is a Si wafer and the second substrate is a silicate wafer; and
   compressing the assembly in the presence of an oxidizing atmosphere under suitable conditions to form a bonding layer between the first and second surfaces, wherein the first bonding surface consists of $O_2H_2Si(1\times1)(100)$ and is formed by cleaning the Si wafer with the Herbots-Atluri clean;
   the second bonding surface comprises a hydrophilic surface layer; and
   the first and second bonding surfaces are different.

2. The method of claim 1, wherein the compressing is at a pressure between about 0 and 10 MPa.

3. The method of claim 1, wherein the compressing is at a temperature less than about 200° C.

4. The method of claim 1, wherein the compressing is at a temperature less than about 1450° C.

5. The method of claim 1, wherein the oxidizing atmosphere is air.

6. The method of claim 5, wherein the air has about 40% to about 80% relative humidity.

7. The method of claim 1, wherein the compressing is maintained for up to 2 hours.

8. The method of claim 1, wherein the first and second surfaces are essentially flat.

9. The method of claim 1, wherein the bonding layer has a bonding strength of at least 10 MPa.

10. The method of claim 1, wherein the second bonding surface is formed by chemical etching followed by chemical oxidation of the silicate wafer.

11. The method of claim 1, wherein the bonding layer consists essentially of silicon, oxygen, and hydrogen.

12. The method of claim 1, wherein
    the second bonding surface comprises SiOx, where $0<x\leq2$.

* * * * *